Feb. 25, 1969 J. F. BLANCHE 3,430,182

ELECTRICAL FEED-THROUGH CONNECTION FOR PRINTED CIRCUIT BOARDS AND PRINTED CABLE

Filed April 27, 1967 Sheet 1 of 2

INVENTOR
JAMES F. BLANCHE

BY George J. Porter

ATTORNEYS

INVENTOR
JAMES F. BLANCHE
BY [signatures]
ATTORNEYS

United States Patent Office 3,430,182

Patented Feb. 25, 1969

3,430,182

ELECTRICAL FEED-THROUGH CONNECTION FOR PRINTED CIRCUIT BOARDS AND PRINTED CABLE

James F. Blanche, Madison, Ala., assignor to the United States of America as represented by the Administrator of the National Aeronautics and Space Administration Filed Apr. 27, 1967, Ser. No. 635,325

U.S. Cl. 339—17 10 Claims

Int. Cl. H05k *1/12;* H02b *1/04;* H01r *33/18*

ABSTRACT OF THE DISCLOSURE

An electrical feed-through connection for an equipment container of the type which may be pressurized or evacuated. The feed-through has a plurality of conducting elements which are mounted flush in insulating material surrounded by a frame. The frame is fastened into the wall of the equipment container. Additional strength is given to the structure by shaping the conducting elements and the inside of the frame in irregular configurations so that the insulating material will form a secure bond at the time of molding. External pressure connectors are fastened to the feed-through by bolts or studs which fit in the tapped holes. The pressure connectors enable printed circuit boards or printed cables to be easily connected to the feed-through.

BACKGROUND OF THE INVENTION

The invention described herein was made by an employee of the United States Government and may be manufactured and used by or for the Government for governmental purposes without the payment of any royalties thereon or therefor.

*Field of the invention*

The invention relates to an electrical feed-through connection and more particularly to a type of electrical feed-through connection for an equipment container utilizing printed circuit boards and printed cable.

*Description of the prior art*

Feed-throughs are used for electrical connection between the inside and outside of electrical equipment enclosures. They are available as single units like spark plugs on internal combustion engines or as multiple units with a number of independent contacts such as the headers used on relays. These feed-throughs consist basically of one or more conductors insulated from a surrounding frame. The feed-through including the frame is installed as an integral part of the wall of the equipment case. Connection wires are usually soldered, welded, screwed or plugged into the conductors, the exact mode of connection used being dependent on the size and use of the feed-through. If the equipment is to be pressurized or evacuated, special attention must be given to the seal between the feed-through conductor and the surrounding insulation.

The usual prior art feed-through devices discussed above required either (1) a fixed type of connection such as is obtained by soldering, welding, or by the use of screws or bolts or (2) a plug-in type of connector. The former connection means was inconvenient because of the time required to make the connection, while the latter means usually utilized projecting pins which might easily be bent out of alignment. Neither of these feed-throughs can be used conveniently with printed cables or circuits. Moreover, they are difficult to use with pressurized or evacuated equipment enclosures because of the difficulty in obtaining a perfect seal of the enclosure.

SUMMARY OF THE INVENTION

Accordingly, it is an object of this invention to provide an improved feed-through connection for equipment enclosures.

A further object of this invention is to provide a faster and more convenient yet reliable feed-through connection for equipment enclosures.

Yet another object of this invention is to provide an improved feed-through connection suitable for sealed equipment enclosures designed to be either pressurized or evacuated.

These and other objects are accomplished in the present invention which provides an electrical feed-through connection for an equipment container. The connection utilizes a feed-through comprising a plurality of conducting elements extending through a flat portion of insulating material. The ends of the conducting elements are mounted flush with the surface of the insulating material on at least one side of the insulating material. The insulating material is surrounded by a frame. Externl pressure connectors are securely fastened to one or both sides of the feed-through. Printed circuit boards or printed cables are connected to the pressure connectors.

*Brief description of the drawings*

The invention will be more fully understood by the following detailed description when taken together with the accompanying drawings in which:

FIGURE 2 is a front elevational view of the feed-through.

FIGURE 11 is a sectional view of an alternative type of connection of two printed circuit boards to a feed-through.

*Description of the preferred embodiments*

Figure 1:
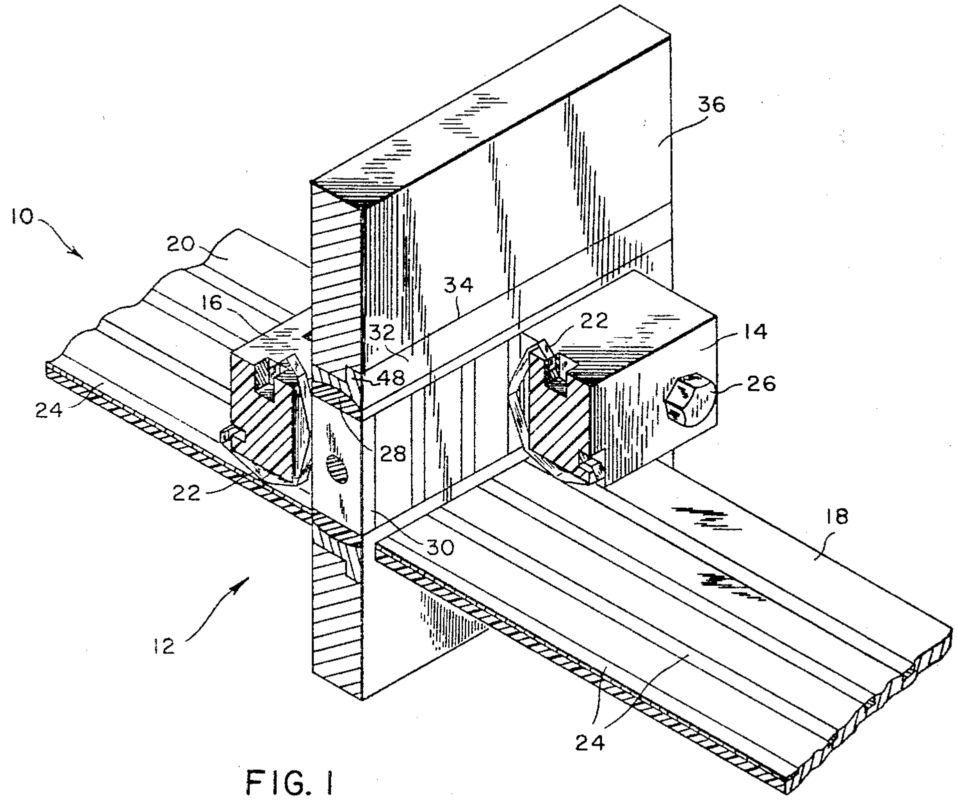
FIGURE 1 is a perspective view of the feed-through connection showing the feed-through, pressure connectors, and two printed circuit boards, all in partial section.

With continued reference to the accompanying figures wherein like numerals designate similar parts throughout the various views and with initial attention directed to FIGURE 1, there is illustrated a typical embodiment of the feed-through connection designated generally by the numeral 10. The feed-through connection 10 includes the feed-through, designated generally by the numeral 12, pressure connectors 14 and 16, and printed circuit boards 18 and 20. Pressure connectors 14 and 16 have one-piece spring clip connectors 22, which make a 90 degree connection from the feed-through 12 to conductors 24 on printed circuit boards 18 and 20. Pressure connectors 14 and 16 are fastened firmly to the feed-through 12 by studs 26.

Figure 2:
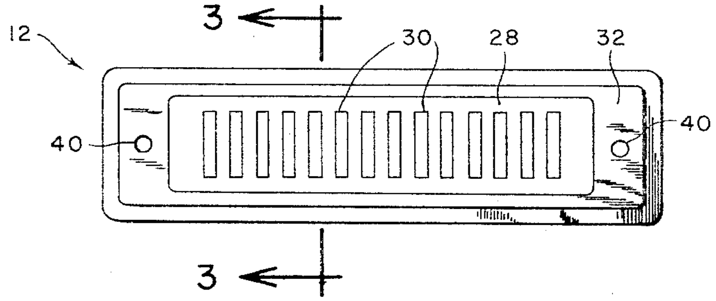

As may be seen in both FIGURES 1 and 2, the feed-through 12 consists of a flat piece of insulating material 28 which has conducting elements 30 molded into it. The insulating material 28 is molded into a surrounding frame 32. Referring again to FIGURE 1, the frame 32 can be cemented into a cut-out 34 in the equipment case wall 36 and thus become an integral part of the wall 36. If a hermetic seal is required, the frame 32 can be soldered or welded into the cut-out 34.

Figure 3:
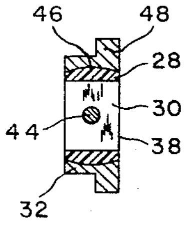
FIGURE 3 is a vertical sectional view of the feed-through taken along line 3—3 of FIGURE 2.

FIGURE 3 is a vertical sectional view of the feedthrough 12 showing a side of a conducting element 30. Each of the conducting elements 30 has end portions 38 which are utilized as contact surfaces. These end portions 38 are substantially flat and are co-planar with the side of the insulating material 28 on one or both sides. Because of the flat contact surfaces of end portion 38, the feed-through 12 is used most advantageously with pressure type connectors, such as 14 and 16 which have already been described. Looking again to FIGURE 1, each spring clip connector 22 of the pressure connectors 14 and 16 makes electrical connection with a corresponding conducting element 30 of the feed-through 12, as well as with a corresponding conductor 24 of printed circuit boards 18 and 20.

As may be seen best in FIGURE 2, tapped holes 40 at either end of the frame 32 are used for fastening the pressure connectors 14 and 16 to the feed-through 12. Two offset tapped holes 40 are bored from opposite sides of each end of the feed-through frame 32. Studs 26 (FIGURE 1) mate with the tapped holes 40.

Looking again to FIGURE 3, a transverse hole 44 is drilled through each of the conducting elements 30 so that, at the time of molding, insulating material 28 may flow into the hole 44 and thus form a stronger mechanical bond between the insulating material 28 and each of the conducting elements 30 of the feed-through 12. A radius 46 is provided in the metal frame 32 and the outer edge of the insulating material 28 to provide additional holding strength for the insulating material 28. As may be seen best in FIGURE 1, the frame 32 may be provided with a lip 48, which acts as a stop and thus positions the feed-through 12 in the equipment case wall 36.

Figures 4, 5:
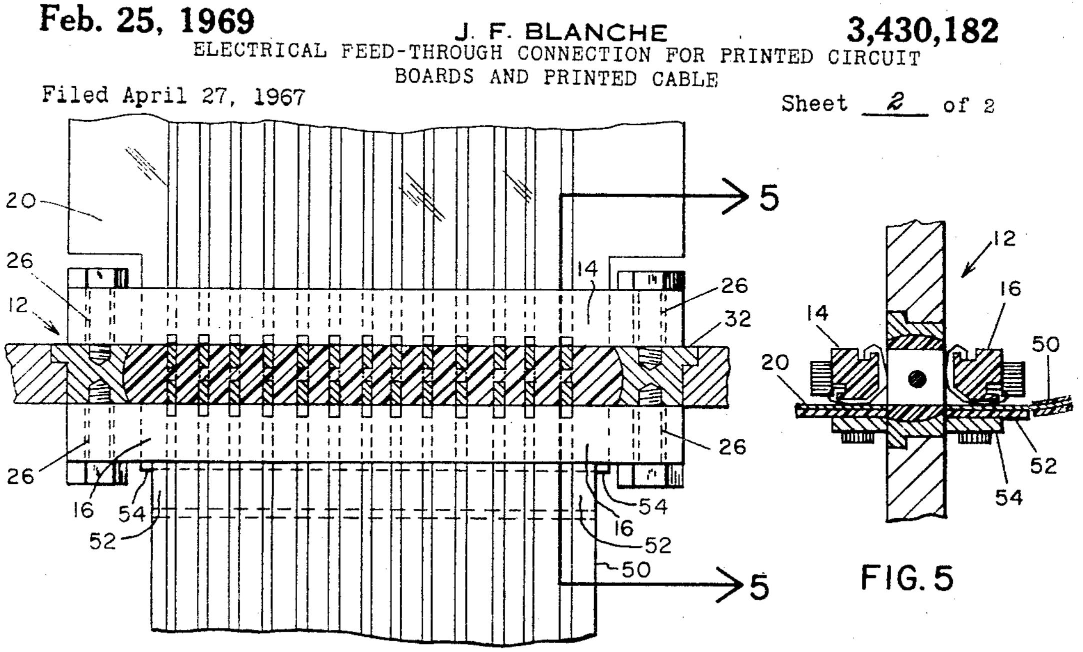
FIGURE 4 is a plan view of an alternative arrangement of the feed-through connection, shown in partial section.
FIGURE 5 is a sectional view of the feed-through connection taken along line 5—5 of FIGURE 4.

FIGURES 4 and 5 show an alternative arrangement for the feed-through connection 12 which utilizes a printed cable 50 on the outside (right side in FIGURE 5) of the feed-through 12. The printed cable 50 is plugged into pressure connector 16 by use of an adapter 52 and is supported at that point by stiff support 54. Printed circuit board 20 is connected to the inside (left side in FIGURE 5) of the feed-through 12 by pressure connector 14. As shown in FIGURE 4, both pressure connectors 14 and 16 are firmly fastened to the feed-through 12 by a pair of directly opposing studs 26.

Figure 6:
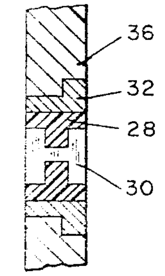
FIGURES 6 through 10 are sectional views of several alternative configurations of the feed-through conducting elements.
Figure 7:
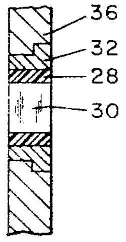
Figure 8:
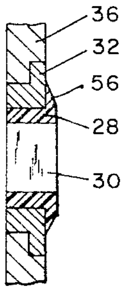
Figure 9:
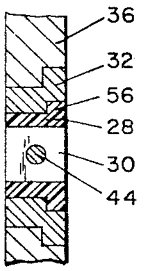
Figure 10:
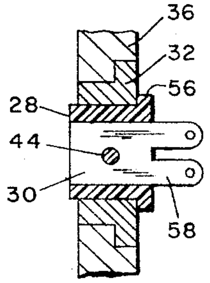

In FIGURES 6 through 10 are shown sectional views of various configurations of the conducting element 30, each of which is an alternative arrangement to the configuration shown in FIGURE 3. Each of the views shows a conducting element 30 embedded in insulating material 28, and the frame 32 which is mounted in the case wall 36. FIGURE 6 illustrates an irregular-shaped conducting element 30 which will produce a stronger bond. In FIGURE 7, an example of a conducting element 30 having a simple configuration is shown. Examples of configurations for the outer edge of the insulating material 28 may take the form of a lip 56, several types of which are shown in FIGURES 8, 9, and 10. FIGURE 10 also illustrates the use of a solder lug 58 at one end of the conducting element 30.

Figure 11:
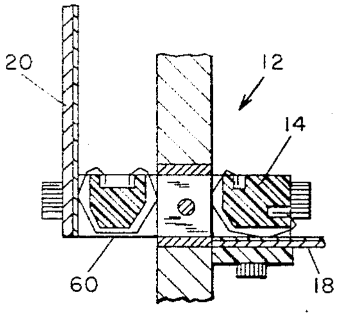
Figure 12:
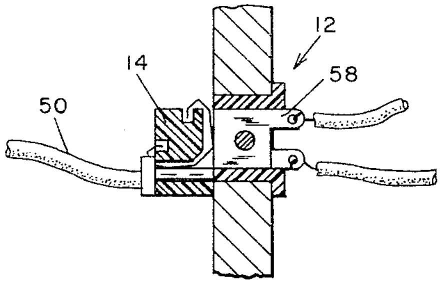
FIGURE 12 is a sectional view of an alternative type of feed-through connection including a printed cable.

Typical alternative arrangements of pressure connectors, other than the arrangements illustrated in FIGURE 1 and in FIGURES 4 and 5, are shown in FIGURES 11 and 12. FIGURE 11 is a sectional view of the connection of two printed circuit boards 14 and 16 to a feed-through 12, utilizing one 180 degree pressure connector 60 and one 90 degree pressure connector 14. FIGURE 12 is a sectional view showing a printed cable 50 connected to a feed-through 12 by a 90 degree pressure connector 14. The connecting elements 30 of feed-through 12 utilize solder lugs 58 on one side, as is also shown in FIGURE 10.

From the foregoing it may be seen that applicant has invented an electrical feed-through connection which: (1) has no pins or holes which require precise alignment or close tolerances; (2) requires no soldering or welding to make an electrical connection; (3) utilizes a feed-through which is flush with the equipment enclosure on one or both sides and becomes integral with the enclosure wall after installation, therefore occupying little or no additional space in equipment; and (4) is well adapted for use in hermetically sealed units.

Obviously, numerous modifications and variations of the present invention are possible in the light of the above teachings. It is therefore to be understood that the invention may be practiced otherwise than is specifically described.

What is claimed is:

1. An electrical feed-through connection for an equipment container comprising:

(a) a feed-through further comprising:
  (1) a flat portion of insulating material;
  (2) a plurality of parallel conducting elements extending through said insulating material, each of said conducting elements having at least one end portion which is substantially flat and co-planar with at least one side of the said insulating material;
  (3) a frame surrounding said portion of the insulating material, said frame being so constructed and arranged that it may be sealed into an equipment container wall;

(b) a pressure connector fastened to said feed-through panel, said pressure connector having a plurality of parallel spring contact members, said contact members being so spaced and arranged that each of said contact members makes electrical contact with a respective one of said conducting elements;

(c) a circuit board having a plurality of parallel conductors thereon, said circuit board being connected to said pressure connector, each of said circuit board parallel conductors being so spaced and arranged that it makes electrical contact with a respective one of said spring contact members, whereby each of said contact board parallel conductors are electrically connected through said spring contact members to a respective one of said feedthrough conducting elements.

2. The electrical feed-through connection of claim 1 including a pair of said pressure connectors and a pair of said circuit boards, wherein one circuit board and one pressure connector are disposed on both sides of the feed-through.

3. The electrical feed-through connection of claim 1 wherein each of said conducting elements has at least one hole drilled laterally through it, a portion of said insulating material extending through each said hole so as to form a mechanical bond between the said insulating material and each of the said conducting elements.

4. The electrical feed-through connection of claim 3 wherein the inside of the said frame has a radius to provide additional strength for holding the insulating material.

5. The electrical feed-through connection of claim 4 including a pair of said pressure connectors and a pair of said circuit boards, wherein one circuit board and one pressure connector are disposed on both sides of the said feed-through.

6. The electrical feed-through of claim 5 wherein said frame has at least one means for the connection of said external pressure connector.

7. An electrical feed-through for an equipment container comprising:

(a) a flat portion of insulating material, (b) a plurality of conducting elements extending through said insulating material, said conducting elements having end portions which are substantially flat and co-planar with at least one side of said insulating material, (c) a frame surrounding said portion of insulating material, said frame being so constructed and arranged that it may be sealed into an equipment container wall, the inside of said frame having a radius to provide additional strength for holding the insulating material.

8. The electrical feed-through of claim 7 wherein each of said conducting elements has at least one hole drilled laterally through it, a portion of said insulating material extending through each said hole so as to form a mechanical bond between the said insulating material and each of the said conducting elements.

9. The electrical feed-through of claim 8 wherein the inside of said frame has a radius to provide additional strength for holding the insulating material.

10. The electrical feed-through of claim 9 wherein said frame has at least one means for the connection of an external pressure connector.

References Cited

UNITED STATES PATENTS

| | | |
|---|---|---|
| 2,742,624 | 4/1956 | Stevens. |
| 2,939,100 | 5/1960 | Watts. |
| 3,077,511 | 2/1963 | Bohrer et al. |
| 3,129,990 | 4/1964 | Rice et al. |
| 3,149,896 | 9/1964 | Hall. |
| 3,215,968 | 11/1965 | Herrmann. |

MARVIN A. CHAMPION, *Primary Examiner.*

P. A. CLIFFORD, *Assistant Examiner.*

U.S. Cl. X.R.

339—59, 126, 48